United States Patent [19]

Wang

[11] Patent Number: 5,554,567
[45] Date of Patent: Sep. 10, 1996

[54] METHOD FOR IMPROVING ADHESION TO A SPIN-ON-GLASS

[75] Inventor: Shih-Ming Wang, Kaohsiung, Taiwan

[73] Assignee: Taiwan Semiconductor Manufacturing Company Ltd., Hsin-Chu, Japan

[21] Appl. No.: 299,268

[22] Filed: Sep. 1, 1994

[51] Int. Cl.⁶ .................................................. H01L 21/469
[52] U.S. Cl. ........................... 437/195; 437/231; 437/238; 437/978; 216/38
[58] Field of Search ..................................... 437/231, 235, 437/238, 228, 978, 195; 156/644.1, 656.1, 657.1; 216/38

[56] References Cited

U.S. PATENT DOCUMENTS

| | | | |
|---|---|---|---|
| 4,986,878 | 1/1991 | Malazgirt et al. | 156/643 |
| 5,003,062 | 3/1991 | Yen | 437/231 |
| 5,254,497 | 10/1993 | Liu | 437/173 |
| 5,334,554 | 8/1994 | Lin et al. | 437/231 |
| 5,364,818 | 11/1994 | Ouellet | 437/231 X |
| 5,376,590 | 12/1994 | Machida et al. | 437/235 |
| 5,447,613 | 9/1995 | Ouellet | 204/192.1 |
| 5,457,073 | 10/1995 | Ouellet | 437/231 |

*Primary Examiner*—Thi Dang
*Attorney, Agent, or Firm*—George O. Saile

[57] ABSTRACT

A method is described for eliminating problems of adhesion, including peeling and blistering, between the surface of a cured spin-on-glass layer and a second deposited layer of a different material. After curing, and prior to the deposition of the second layer, the layer of spin-on-glass is subjected to a short heat treatment in vacuum. The second layer is then deposited without breaking the vacuum.

12 Claims, 2 Drawing Sheets

METHOD FOR IMPROVING ADHESION TO A SPIN-ON-GLASS

BACKGROUND OF THE INVENTION (1) Field of the Invention

This invention relates in general to semiconductor device processing, and more particularly to a method for improving the adhesion between a layer of a spin-on-glass and a layer of another material.

(2) Description of the Prior Art

In general, integrated circuits are built by depositing a series of layers one on top of another. After the deposition of each layer, and prior to the deposition of the next one, the layer is subjected to an etching procedure which shapes it into a pattern of lines and distinct areas. As a result, what started out as a completely planar surface becomes increasingly more irregular as successive layers of material partially cover the surface. Thus, it becomes necessary to include in the process of making an integrated circuit some means for returning the surface to a planar condition. If this is not done, problems soon arise with, for example, the alignment of successive masks that are used to define the patterns into which the different layers will be etched.

One way of achieving planarization is to deposit a layer that is initially in the liquid state. Such a layer will seek its own level rather than contouring the surface onto which it is deposited—as is the case with layers that are deposited directly in solid form. It then remains to convert the liquid layer into a solid one (with properties that are compatible with the intergrated circuit as a whole, including any subsequent manufacturing steps). Assuming the newly created solid layer retains the same surface geometry as the liquid layer from which it derived, planarization of the surface will have been achieved. One class of materials that can start out as liquids and then be converted to suitable solids are the siloxanes.

Siloxanes are a class of compounds containing silicon, oxygen, and hydrocarbon radicals such as $CH_3$ or $C_2H_5$. Spin-on glasses are created by dissolving a siloxane in a suitable solvent, such as methyl alcohol, adjusting the concentration of the solution so as to obtain the right viscosity, and then applying it to the surface of, for example, a semiconductor wafer so as to form a layer of a predetermined thickness. Thickness is controlled by dripping a measured amount of the solution onto the surface of a spinning wafer in the same way that photoresist is applied. The siloxane solution is then allowed to dry, following which it is subjected to heat treatment (typically 250° C. for approximately 5 minutes) to drive out the solvent, followed by curing in an oxygen atmosphere at about 420° C. During curing the silicon in the siloxane is converted to $SiO_2$ while the other components are converted to volatile byproducts, such as $H_2O$ and $CO_2$. The resulting layer is referred to as cured spin-on-glass (SOG).

Once the SOG has been cured it may be etched back to some desired thickness. After the optional etch back procedure, the next step in the manufacture of the integrated circuit would be to deposit an additional layer of insulating or conductive material onto the surface of the SOG. If this is done immediately, there should be no problem relative to the adhesion of the newly deposited film to the surface of the cured SOG. However, we have observed that if a relatively short time of only about three hours (or more) is allowed to elapse between these two steps, an adhesion problem is likely to arise. This adhesion problem manifests itself as a series of bubbles or blisters that appear at the interface between the surface of the cured SOG and the layer immediately above it.

One way of dealing with this problem that has been described in the prior art has been to etch away the cured SOG so that the original surface over which the film of siloxane solution was spread is exposed once again. Such a procedure is described by, for example, A. Malazgirt et al in U.S. Pat. No. 4,986,878 Jan. 1991. This is not an adequate solution to the problem since SOG still remains in the valleys between the higher areas of the original surface. If etching were allowed to continue beyond the point at which the first of the original surfaces were once again exposed, material would be removed that needed to stay behind. Furthermore, stopping the etch-back procedure at exactly the right point presents a formidable control problem. An additional, though less serious, objection to this approach is that the layer of cured SOG that has been removed must now be replaced by a layer of some other material.

Heat treatment of a cured SOG has been described in the prior art but the purpose of such heat treatment as well as the manner in which the heat is applied and the timing within the overall integrated circuit manufacturing process at which these heat treatments occur are all different from the present invention.

In general, use of heat treatment for cured SOGs has been motivated by a need to solve the inversion problem. The inversion problem is a consequence of the fact that certain small metallic ions, particularly sodium ions, are known to have the capability to diffuse rapidly through a SOG because of the latter's relatively porous structure. When such ions end up near a semiconductor surface that is in contact with the SOG, they electrostatically attract negative carriers within the semiconductor and increase their concentration near the SOG-semiconductor interface. This local concentration of negative carriers is termed an inversion layer. Such a layer is highly undesirable since, at worst, it can cause a metal-oxide-semiconductor (MOS) device to be permanently ON or OFF and, at a minimum, it will change the operating characteristics of the device in an unpredictable manner.

An example of heat treatment of a SOG that has been described in the prior art is that given by Lin et al in U.S. Pat. 07/825,371 Jan. 1992. The method of that invention requires that the heat treatment be performed in an atmosphere of nitrogen gas. Quite a different method for dealing with the inversion problem is that described by Liu in U.S. Pat. 5,254,497 Oct. 1993. In this approach, the cured SOG, as well as any subsequently deposited metallurgy, is irradiated with ultra-violet light.

An important objective of this invention has been to come up with an effective solution to the problem of poor adhesion to SOGs that have been exposed to atmosphere for a period of about a few hours, or more, prior to the deposition of another layer.

A further objective of the present invention has been to provide a solution that does not require the removal of any part of the SOG layer itself. Such a solution has been achieved and takes the form of providing an effective heat treatment at the correct point in the overall process.

SUMMARY OF THE INVENTION

In accordance with the present invention, and the above objects of the invention, there is provided an effective method for preparing the surface of a cured spin-on-glass such that a layer of another material deposited onto the surface of said spin-on-glass will adhere well to it and will not exhibit any tendency to peel or blister.

DESCRIPTION OF THE PREFERRED EMBODIMENTS

SOGs are commonly used in the manufacture of integrated circuits in order to achieve planarization of the surface. As the integrated circuit gets built up, layer by layer, its surface becomes increasingly uneven. This lack of planarity reduces the degree of precision with which each succeeding pattern (into which the most recently deposited layer will be shaped) can be aligned with respect to the pattern that preceded it.

SOGs are useful materials for achieving planarization since they may be applied to a surface in liquid form and then converted to solid form, in situ, through suitable heat treatment. While in liquid form, the SOG flows into all the depressions in the surface to which it was applied, presenting a planar surface of its own once flow has ceased. The solid material to which it is converted after heat treatment is essentially silicon dioxide which is compatible with the other materials that form the integrated circuit as well as being compatible with any subsequent processing steps yet to be performed on the integrated circuit.

Once creation of the SOG layer has been completed, manufacture of the integrated circuit continues with the application of another layer of material. It was observed as part of manufacturing experience that the adhesion of such a layer to the surface of the SOG was not always satisfactory. On occasion, the layer would delaminate or pull away from the surface of the SOG in certain areas, as manifested through blistering or peeling.

An investigation of this phenomenon revealed that the aforementioned blistering was the result of moisture in the SOG that was precipitating in the form of tiny bubbles at the interface between the applied layer and the SOG surface. An important observation that was made as part of this investigation was that the moisture that was emerging from within the body of the SOG was not present in the SOG immediately after it had been cured. Instead, the moisture was being absorbed into the SOG between the time it was cured and the time of application of the new layer.

It was further determined that this problem of moisture absorption by the cured SOG could be eliminated by heating the SOG, at any time after it had been cured, for not less than about 0.5 minutes at a temperature between 350 and 450° C. in a vacuum of not more than about 3 torr. Provided the vacuum was not broken prior to the application of the next layer, said next layer was found to have good adhesion to the surface of the SOG, with no blistering or peeling.

Figure 1:
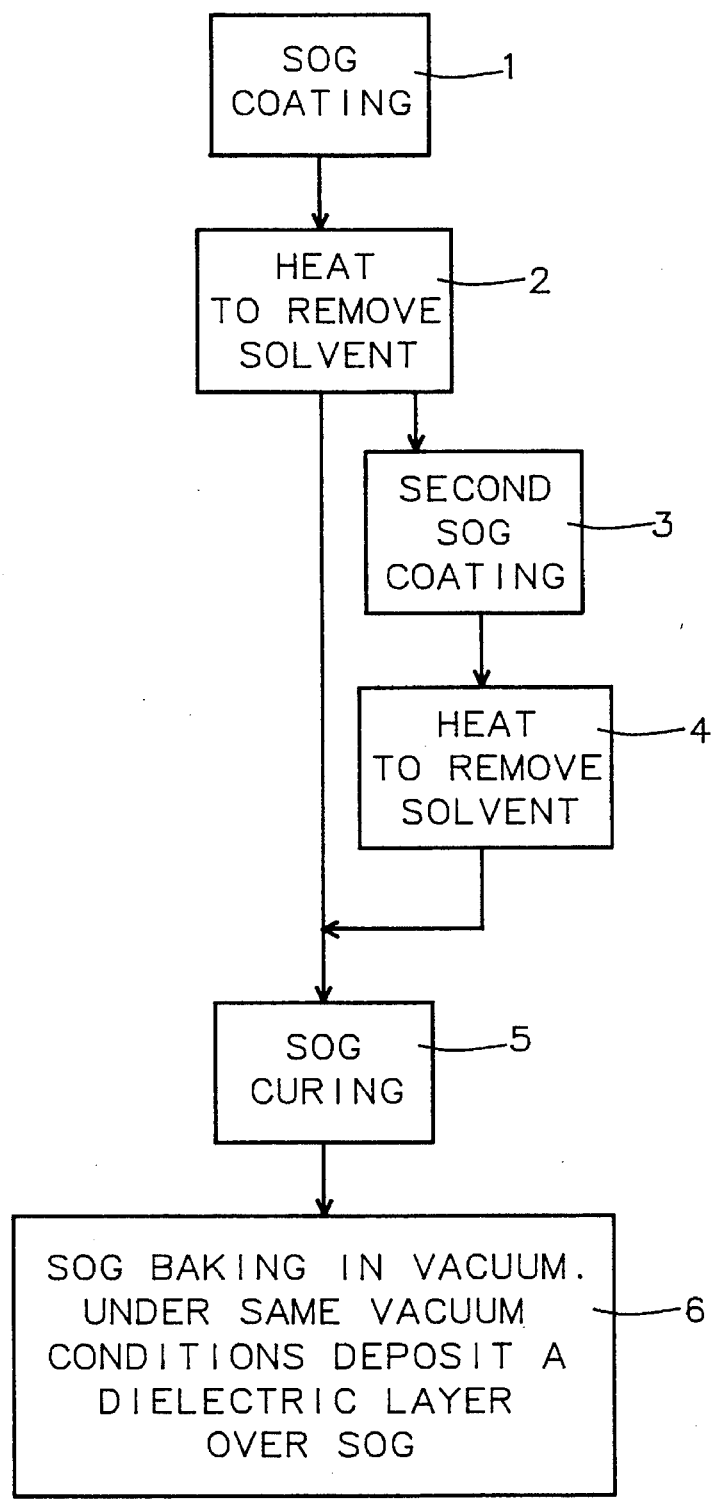
FIG. 1 is a flow chart illustrating the steps that must be taken to practice the present invention.

Referring now to FIG. 1, we show a flow diagram of the steps within the integrated circuit manufacture process that represent the practice of the present invention, starting with the deposition of an initial (uncured) SOG coating (siloxane solution) and ending with the deposition of a dielectric layer onto the surface of the cured SOG. It should be understood that the scope of the invention is not limited to any particular material with respect to the layer that is to be deposited onto the surface of the SOG, a dielectric layer having been chosen merely for purposes of illustration. In step 1 a coating of a siloxane solution is applied to the surface of the integrated circuit. In step 2, heat (typically 250° C. for 5 minutes) is applied to remove the solvent. In steps 3 and 4, an optional second coating of siloxane solution may be applied in cases where a particularly thick layer is desired. In step 5, the coating is cured by heating in oxygen for about 40 minutes at 420° C. In step 6, the SOG is baked in a vacuum that is not greater than about 3 torr, at a temperature between 350 and 450° C. for not less than about 0.5 minutes. Without allowing any increase in the pressure, a dielectric layer is now deposited onto the surface of the SOG.

Figure 2:
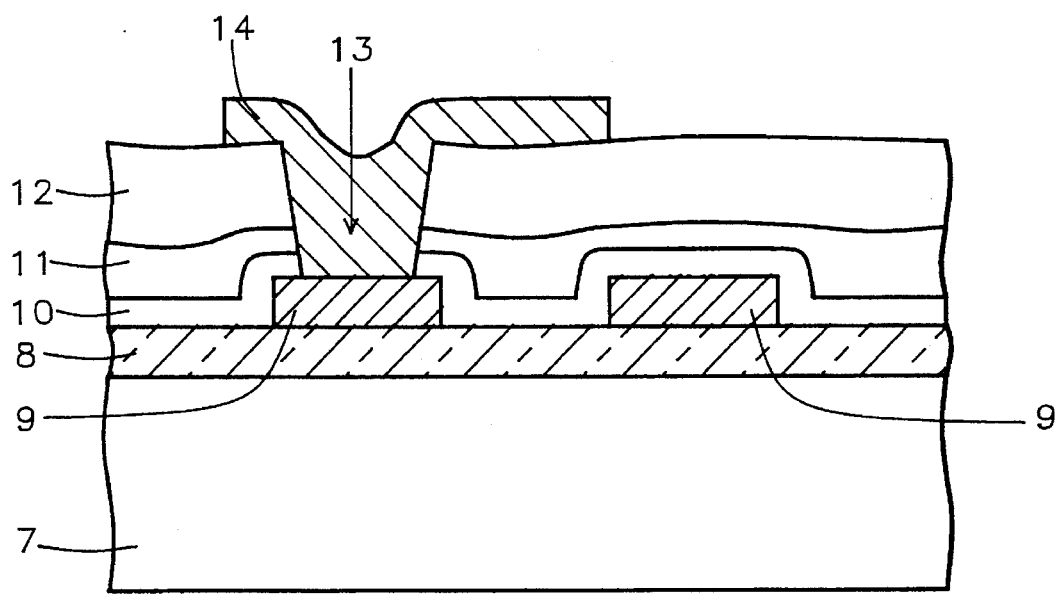
FIG. 2 is a cross-section through a portion of an integrated circuit illustrating the application of the invention.

In FIG. 2, we show a schematic cross-section through a portion of an integrated circuit that has been manufactured according to the method of the present invention. A body of silicon 7 has a surface layer 8 of silicon oxide. A metallic layer 9 (seen as two lines shown edge on) has been applied to the upper surface of 8 and then covered with a layer of dielectric 10. As can be seen, layer 10 follows the contours of layer 9, that is, it is not planar. A SOG layer 11 has been applied to the outer surface of layer 10 creating a new outer surface which is approximately planar.

Continuing to refer to FIG. 2, in accordance with the practice of the present invention, after layer 11 had been cured the integrated circuit was heated in a vacuum that was not greater than about 3 torr, at a temperature between 350° and 450° C. for not less than about 0.5 minutes. Without allowing any increase in the pressure within the chamber that contains said integrated circuit, the dielectric layer 12 was then deposited onto the surface of the SOG. A via hole 13 was then etched through layers 10, 11, and 12 down to the outer surface of layer 9 and a second metallic layer 14 was deposited inside said via hole so as to make contact with layer 9.

Figure 3:
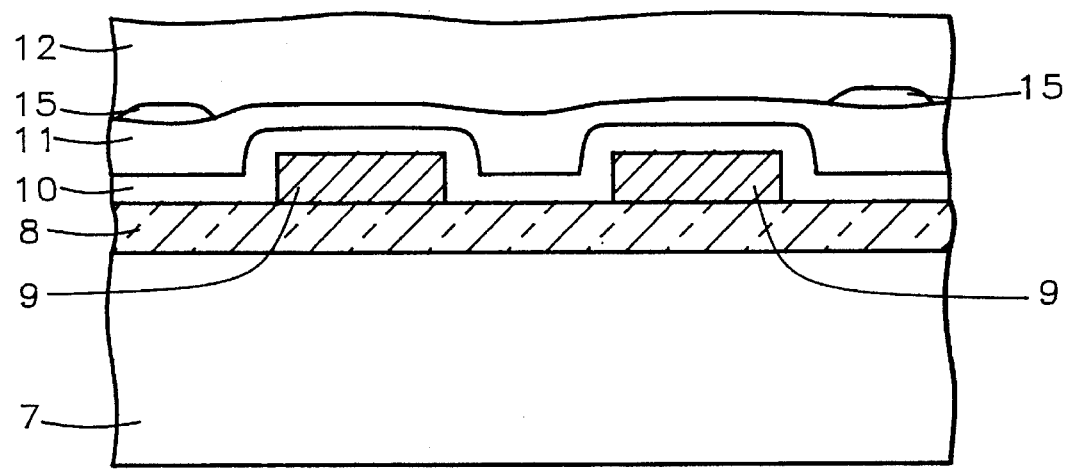
FIG. 3 is a cross-section through a portion of an integrated circuit illustrating problems that may occur if the invention is not practiced.

In FIG. 3 we show, schematically, what has been observed to occur if the practice of the present invention was not followed. That is, if the cured SOG was not heated in vacuum prior to the deposition of the second dielectric layer and/or vacuum was broken between the heat treatment and the deposition of the dielectric layer. As in FIG. 2, the layer of SOG 11, has planarized the surface following the overcoating of metal layers 9 by the first dielectric layer 10. However, as a consequence of not following the method of the present invention blisters 15 have appeared at the interface between the cured SOG and a second dielectric layer 12 deposited thereon.

In order to determine the optimum conditions for the practice of the present invention, a method was devised for the observation of the moisture as it emerged from within a layer of cured SOG that had been allowed to make contact with the atmosphere for some period of time:

After curing, the SOG layers under investigation were allowed to sit in the open air for a predetermined period of time. They were then heated in vacuum for varying lengths of time (including none) following which all samples received a coating of silicon nitride (Si3N4). This was then followed by the deposition of a dielectric coating (corresponding to the layer labelled 12 in FIGS. 2 and 3). For purposes of the experiment the dielectric layer was deposited by means of chemical vapor deposition (CVD). Any bubbles of moisture that emerged from within the SOG layer, during and after CVD, then became trapped at the SOG-silicon nitride interface and could be observed, and counted, under a microscope.

The results of these experiments are shown in the following examples and serve to illustrate the important features of the invention as well as to aid in the understanding thereof and variations may be made by one skilled in the art without departing from the spirit and scope of the invention.

EXAMPLES

TABLE I

| Time sample left in open air prior to CVD | Number of bubbles at silicon nitride interface after CVD |
|---|---|
| 0 hours | 0 |
| 3 hours | 0 |
| 5 hours | 2 |
| 10 hours | 1 |
| 24 hours | 20 |
| 68 hours | 200 |

| Time sample was heated at 400° C. prior to CVD | Number of bubbles at silicon nitride interface after CVD |
|---|---|
| 0 seconds | 200 |
| 6 seconds | 25 |
| 10 seconds | 7 |
| 15 seconds | 0 |
| 30 seconds | 0 |
| 60 seconds | 0 |
| 120 seconds | 0 |

These results show that exposure to the atmosphere for little more than 3 hours after curing can render the surface of a SOG liable to adhesion problems with respect to a subsequently deposited layer. They also point out that this problem may be solved by heating the SOG in vacuum and then depositing the subsequent layer without breaking the vacuum. Note that said subsequently deposited layer could be either a dielectric layer, as description above, or an electrically conductive layer and that it could have been deposited by any of several deposition methods including, vacuum evaporation, and sputtering While the invention has been particularly shown and described with reference to the preferred embodiments thereof, it will be understood by those skilled in the art that various changes in form and details may be made without departing from the spirit and scope of the invention.

What is claimed is:

1. A method for planarizing the surface of an integrated circuit comprising:

providing a layer of silicon dioxide on the surface of a silicon body;

depositing a layer of a first conductive material onto said silicon dioxide surface;

etching said layer of a first conductive material into a pattern;

depositing a layer of a first insulating material onto said etched layer of conductive material;

applying a siloxane solution to the surface of said integrated circuit such that all points on said surface lie below the surface of said siloxane solution;

heating said integrated circuit so as to drive out all solvent from said siloxane solution;

optionally applying a second layer of siloxane solution and then heating it to drive out the solvent;

heating said integrated circuit in an oxygen atmosphere so as to cure said layer or layers of siloxane thereby converting them to a layer of cured spin-on-glass;

providing a vacuum chamber and then baking said integrated circuit inside said vacuum chamber at a pressure less than about 3 torr for between 0.5 and 3 minutes;

without allowing any increase in the pressure within said vacuum chamber, depositing a layer of a second insulating material onto the surface of said layer of cured spin-on-glass;

etching via holes from the surface of said layer of a second insulating material down to the level of said first layer of conductive material;

depositing a second layer of a conductive material onto the surface of said layer of a second insulating material so as to make contact with said first layer of conductive material wherever said via holes have been etched and;

etching said second layer of conductive material into a pattern.

2. The method of claim 1 where the temperature at which said cured spin-on-glass layer is baked is between 350° C. and 450° C.

3. The method of claim 1 where said layer of a second insulating material is deposited by means of chemical vapor deposition.

4. The method of claim 1 where said layer of a second insulating material is deposited by means of vacuum evaporation.

5. The method of claim 1 where said layer of a second insulating material is deposited by means of sputtering.

6. A method for preparing the surface of a layer of cured spin-on-glass prior to the deposition of a layer of a different material, comprising:

heating said cure spin-on-glass layer inside a vacuum chamber, in which the pressure is less than about 3 torr, for between 0.5 and 3 minutes and;

depositing said layer of a different material onto the surface of said cured spin-on-glass layer without prior readmission of the surrounding atmosphere back into said vacuum chamber.

7. The method of claim 1 where the temperature at which said cured spin-on-glass layer is heated is between 350° C. and 450° C.

8. The method of claim 1 where said layer of a different material is comprised of an electrically insulating material.

9. The method of claim 1 where said layer of a different material is comprised of an electrically conductive material.

10. The method of claim 1 where said layer of a different material is deposited by means of chemical vapor deposition.

11. The method of claim 1 where said layer of a different material is deposited by means of vacuum evaporation.

12. The method of claim 1 where said layer of a different material is deposited by means of sputtering.

* * * * *